US009187300B2

(12) United States Patent
Yoshioka et al.

(10) Patent No.: US 9,187,300 B2
(45) Date of Patent: Nov. 17, 2015

(54) ARTICLE STORAGE FACILITY

(71) Applicant: Daifuku Co., Ltd., Osaka-shi (JP)

(72) Inventors: Hideo Yoshioka, Gamo-gun (JP); Atsushi Fujiwara, Gamo-gun (JP); Ryou Yamashita, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 161 days.

(21) Appl. No.: 13/850,525

(22) Filed: Mar. 26, 2013

(65) Prior Publication Data

US 2014/0110192 A1    Apr. 24, 2014

(30) Foreign Application Priority Data

Mar. 27, 2012  (JP) ................................ 2012-071916

(51) Int. Cl.
*B66F 9/07* (2006.01)
*B65G 1/02* (2006.01)
*B65G 1/04* (2006.01)
*H01L 21/677* (2006.01)

(52) U.S. Cl.
CPC . *B66F 9/07* (2013.01); *B65G 1/026* (2013.01); *B65G 1/0407* (2013.01); *H01L 21/67769* (2013.01)

(58) Field of Classification Search
CPC .......... B66F 9/07; B65G 1/0407; B65G 1/026
USPC ......... 182/36, 37, 38, 39, 131, 141, 142, 148, 182/223; 414/273, 280
See application file for complete search history.

(56) References Cited

U.S. PATENT DOCUMENTS

| 1,554,584 | A | * | 9/1925 | Lake | 414/246 |
|---|---|---|---|---|---|
| 2,915,203 | A | * | 12/1959 | Kurmer | 414/229 |
| 3,125,235 | A | * | 3/1964 | Frangos | 414/239 |
| 3,402,835 | A | * | 9/1968 | Saul | 414/273 |
| 3,421,641 | A | * | 1/1969 | Frey | 414/744.6 |
| 3,490,616 | A | * | 1/1970 | Castaldi | 414/273 |
| 4,936,730 | A | * | 6/1990 | Morioka | 414/239 |
| 5,383,757 | A | * | 1/1995 | Takaoka et al. | 414/240 |
| 7,635,246 | B2 | * | 12/2009 | Neeper et al. | 414/280 |
| 7,771,152 | B2 | * | 8/2010 | Waltersbacher | 414/280 |
| 8,033,773 | B2 | * | 10/2011 | Zangerle | 414/258 |
| 8,670,861 | B2 | * | 3/2014 | Yoshinaga | 700/218 |

(Continued)

FOREIGN PATENT DOCUMENTS

| DE | 10038666 C1 | * | 1/2002 | ............... B66F 9/07 |
|---|---|---|---|---|
| GB | 1432224 A | * | 4/1976 | ............... B66F 9/07 |

(Continued)

*Primary Examiner* — Colleen M Chavchavadze
(74) *Attorney, Agent, or Firm* — The Webb Law Firm

(57) ABSTRACT

An article storage facility includes an elevating scaffold capable of ascending/descending in a movement space across a withdrawal height that is set on an upper side and a plurality of working heights that are set in intermediate locations in the movement space in the vertical direction. A plurality of support bodies that support the elevating scaffold are provided in the vertical direction so as to respectively correspond to the plurality of working heights, and at least a support body other than the lowermost support body of the plurality of support bodies is configured to be movable to an acting position at which the support body protrudes toward the movement space so as to support the elevating scaffold and a withdrawal position at which the support body retracts toward the article storage shelf so as not to come into contact with the elevating scaffold moving up and down.

14 Claims, 19 Drawing Sheets

(56) References Cited

U.S. PATENT DOCUMENTS

| | | | |
|---|---|---|---|
| 2005/0095095 A1* | 5/2005 | Hansl | 414/280 |
| 2008/0044262 A1* | 2/2008 | Kim et al. | 414/273 |
| 2008/0247848 A1* | 10/2008 | Freudelsperger | 414/277 |
| 2011/0315479 A1* | 12/2011 | Yoshioka | 182/129 |
| 2011/0315488 A1* | 12/2011 | Yoshioka | 187/262 |
| 2012/0189411 A1* | 7/2012 | Yoshinaga | 414/273 |
| 2013/0075196 A1* | 3/2013 | Upmeyer et al. | 182/148 |

FOREIGN PATENT DOCUMENTS

| | | |
|---|---|---|
| JP | 08310608 A | 11/1996 |
| JP | 2004035145 A | 2/2004 |
| JP | 2009073627 A | 4/2009 |
| JP | 2011020778 A | 2/2011 |

* cited by examiner

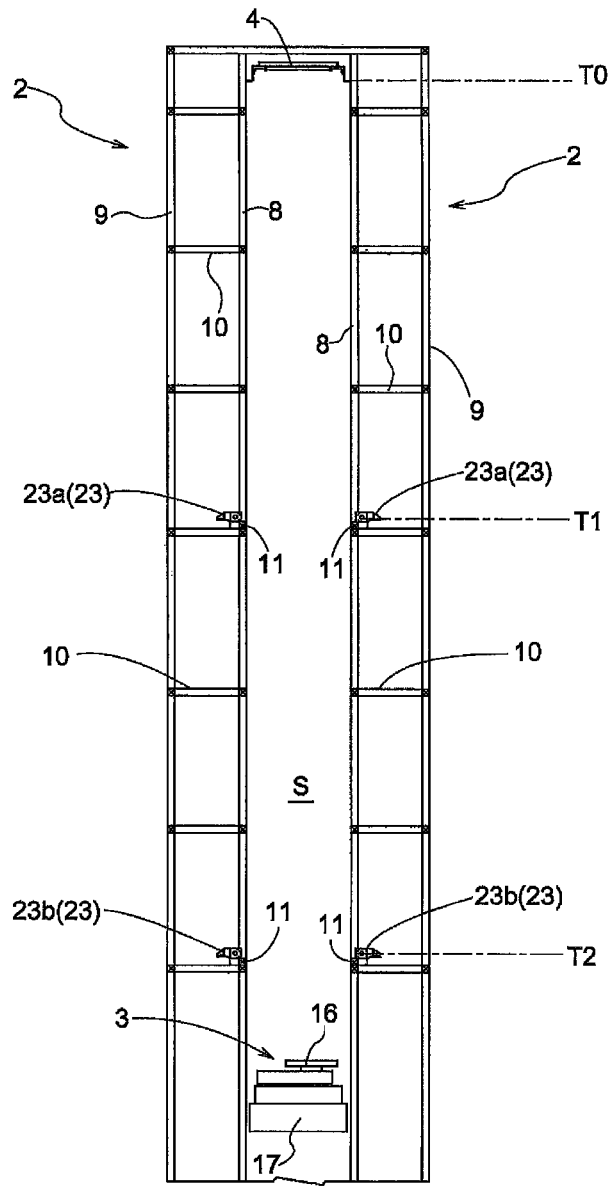

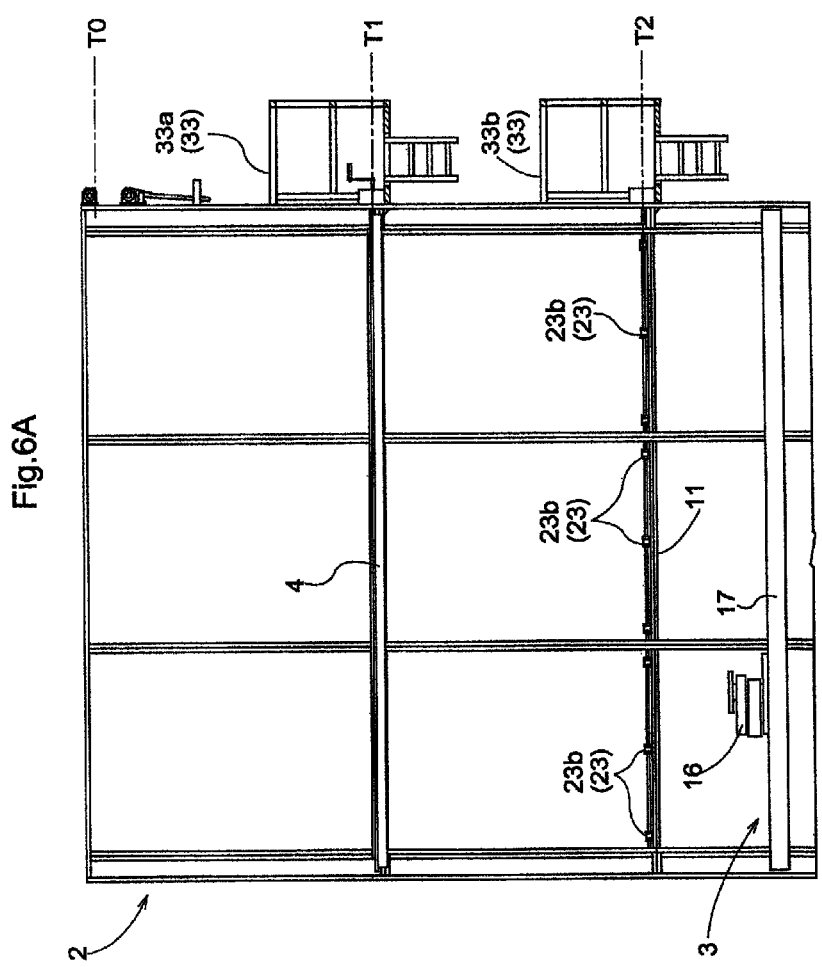

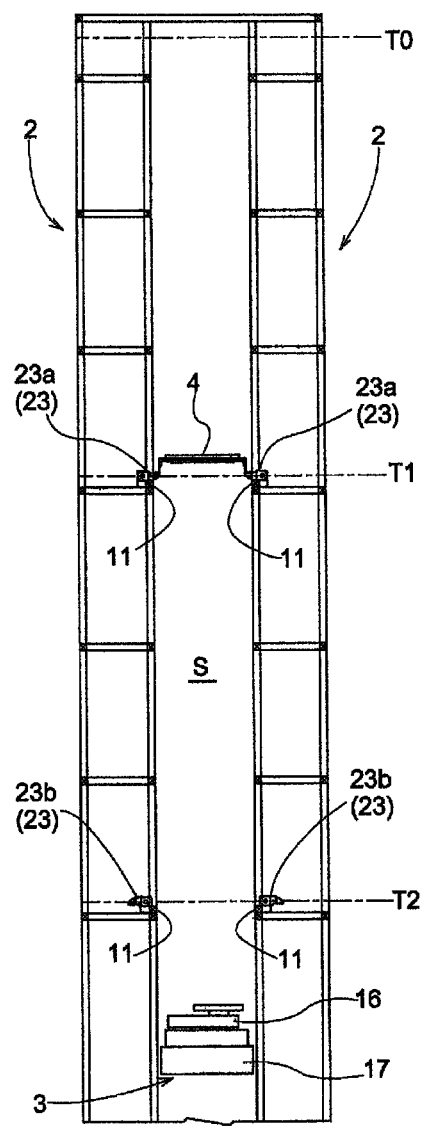

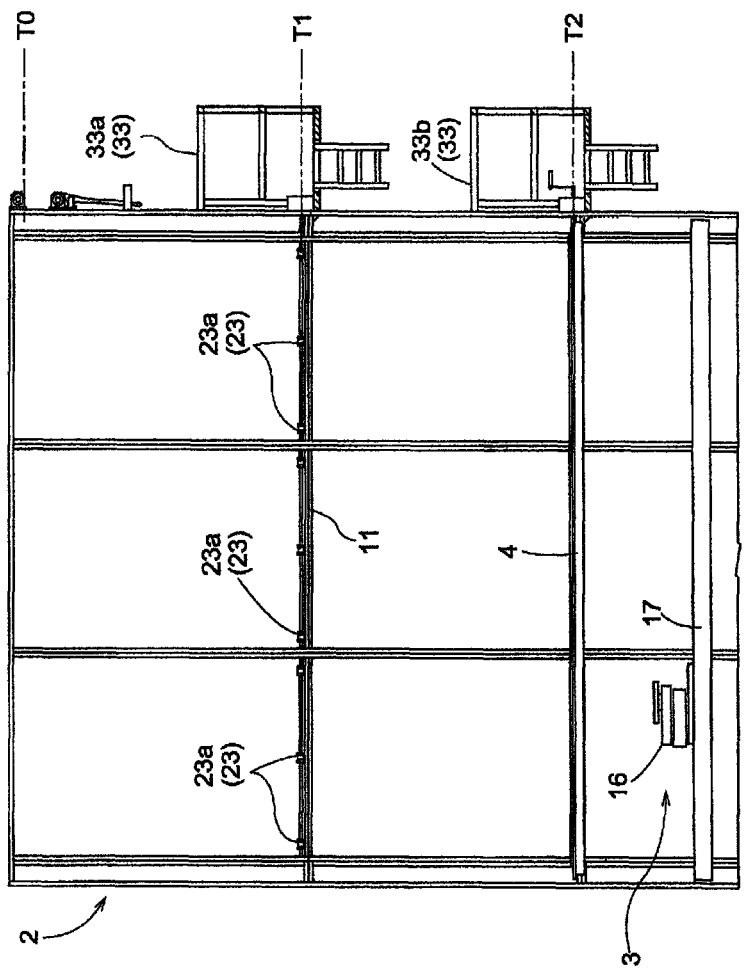

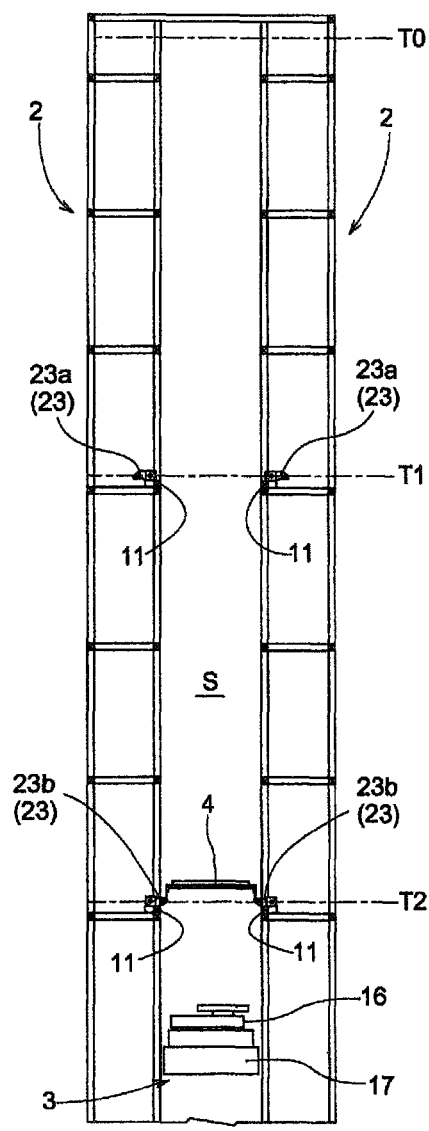

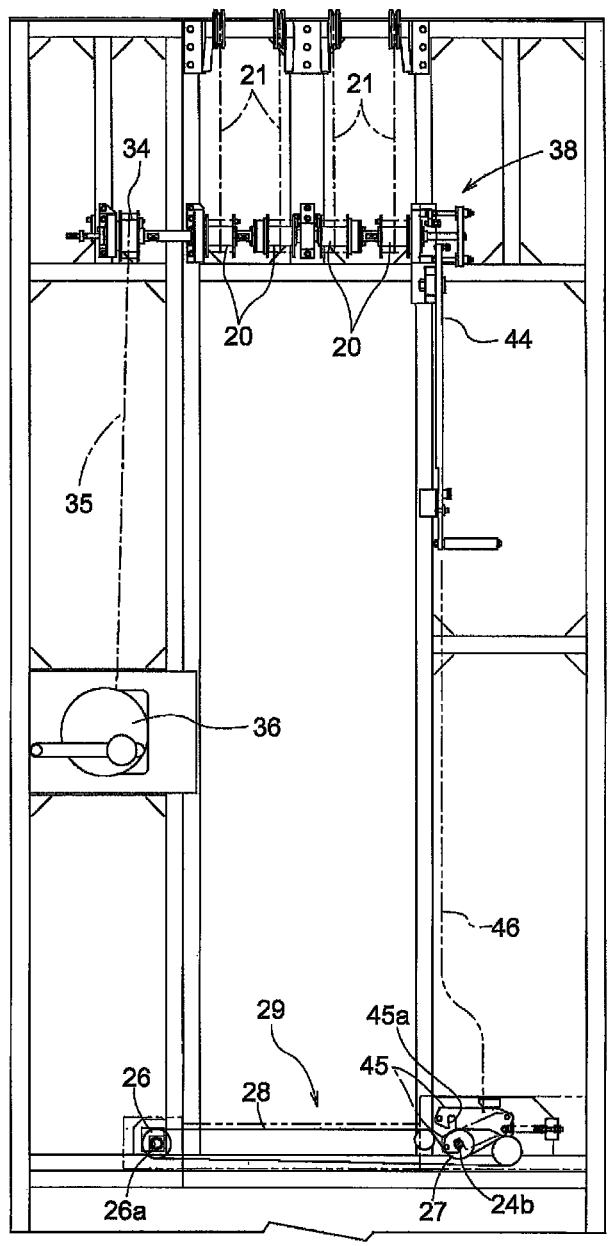

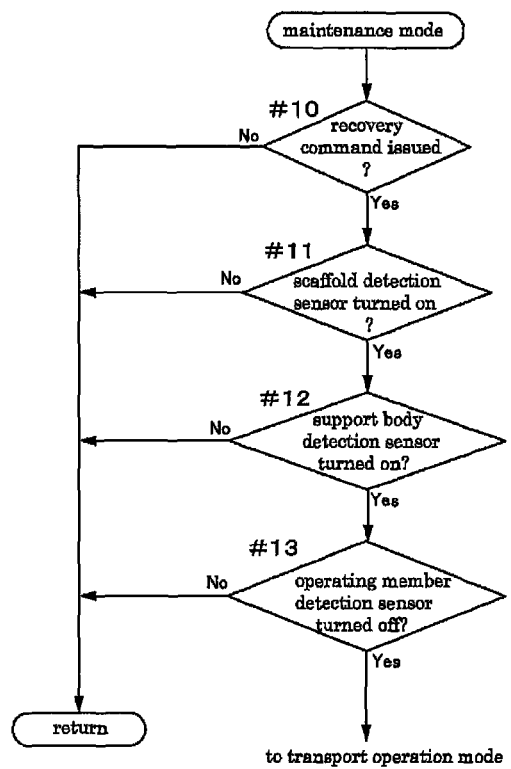

the article storage shelves by climbing on the elevating scaffold. In other words, the elevating scaffold is configured to be capable of moving up and down across a withdrawal height that is set on the upper side from the movement range in the above-described movement space of the transfer device included in the transport device in the vertical direction and a working height that is set in an intermediate location in the movement space in the vertical direction. Also, in a state in which the elevating scaffold is caused to descend from the withdrawal height to the working height, and the elevating scaffold is supported by a support body for supporting the elevating scaffold located at the working height, the operator climbs on the elevating scaffold and performs a maintenance work. Accordingly, when the elevating scaffold has been lowered to the working height, the elevating scaffold is supported on the support body, and thereby the elevating scaffold is stabilized, making it easy for the operator to perform a maintenance work in a state in which he or she is on the elevating scaffold. When no maintenance work is performed, the elevating scaffold is elevated to the withdrawal height, thus allowing the transport device to transport articles using the space below the elevating scaffold.

ARTICLE STORAGE FACILITY

FIELD OF THE INVENTION

The present invention relates to an article storage facility provided with an article storage shelf in which storage portions for storing articles are arranged in the vertical direction and the transverse width direction of the shelf and a transport device that transports articles to the plurality of storage portions.

BACKGROUND

JP 2009-073627A (Patent Document 1) discloses an example of article storage facilities as described above. With the configuration of Patent Document 1, an elevating scaffold capable of ascending and descending in a movement space in front of article storage shelves is provided. This allows a maintenance work for lower portions of the article storage shelves to be performed from the floor without using the elevating scaffold, and, for higher portions of the article storage shelves, for which the operator on the floor is unable to perform a maintenance work, allows the operator to perform a maintenance work on the article storage shelves by climbing on the elevating scaffold. In other words, the elevating scaffold is configured to be capable of moving up and down across a withdrawal height that is set on the upper side from the movement range in the above-described movement space of the transfer device included in the transport device in the vertical direction and a working height that is set in an intermediate location in the movement space in the vertical direction. Also, in a state in which the elevating scaffold is caused to descend from the withdrawal height to the working height, and the elevating scaffold is supported by a support body for supporting the elevating scaffold located at the working height, the operator climbs on the elevating scaffold and performs a maintenance work. Accordingly, when the elevating scaffold has been lowered to the working height, the elevating scaffold is supported on the support body, and thereby the elevating scaffold is stabilized, making it easy for the operator to perform a maintenance work in a state in which he or she is on the elevating scaffold. When no maintenance work is performed, the elevating scaffold is elevated to the withdrawal height, thus allowing the transport device to transport articles using the space below the elevating scaffold.

For article storage facilities, article storage shelves having large heights may sometimes be installed in order to increase the article storage efficiency. In such a case, the range for which the operator on the floor cannot perform a maintenance work in the vertical direction of the article storage shelves is wide in the vertical direction. However, in the article storage facility of Patent Document 1, only a single working height is set in the vertical direction, and therefore the range for which a maintenance work can be performed from the elevating scaffold at the working height is limited in the vertical direction. Accordingly, there will be locations in the article storage shelves for which a maintenance work cannot be performed.

It is conceivable to set a plurality of working heights in order to eliminate locations for which a maintenance work cannot be performed. However, the support body that supports the elevating scaffold protrudes toward the movement space, and thus the elevating scaffold cannot be moved below the height at which the support body is located. This has made it impossible to set a plurality of working heights.

As such, the method disclosed in Patent Document 1 poses a problem in that an appropriate maintenance work cannot be carried out for article storage shelves with large heights.

SUMMARY OF THE INVENTION

In view of the foregoing, there is a need to achieve an article storage facility that enables an appropriate maintenance work even for article storage shelves having large heights.

An article storage facility according to the present invention includes: an article storage shelf in which storage portions for storing articles are arranged in a vertical direction and a transverse width direction of the shelf; a transport device that transports articles to the plurality of storage portions; a transfer device that is provided in the transport device and that transfers articles to and from the storage portion, the transfer device being configured to be movable in a movement space, located in front of the article storage shelf, in the vertical direction and the transverse width direction of the shelf; an elevating scaffold capable of ascending/descending in the movement space across a withdrawal height that is set on an upper side from a movement range of the transfer device in the movement space in the vertical direction and a working height that is set in an intermediate location in the movement space in the vertical direction; and a support body that supports the elevating scaffold located at the working height, wherein a plurality of the working heights are set in the vertical direction, a plurality of the support bodies are provided in the vertical direction so as to respectively correspond to the plurality of working heights, and at least a support body other than a lowermost support body of the plurality of the support bodies is a movable support body that is configured to be movable to an acting position at which the aforementioned support body protrudes toward the movement space so as to support the elevating scaffold and a withdrawal position at which the aforementioned support body retracts toward the article storage shelf so as not to come into contact with the elevating scaffold moving up and down.

With the above-described configuration, moving the movable support body to the acting position allows the elevating scaffold to be supported on the support body at the working height corresponding to the movable support body, and moving the movable support body to the withdrawal position allows the elevating scaffold to be moved below the height at which the movable support body is located.

By moving the movable support body corresponding to the target working height to the acting position and moving a movable support body located above the movable support body to the withdrawal position when lowering the elevating scaffold from the withdrawal height to the working height, it is possible to lower the elevating scaffold to the target working height among the plurality of working heights. Thus, the elevating scaffold can also be lowered to the target working height even when a plurality of working heights are set, and the elevating scaffold can be supported on the support body at that working height.

Accordingly, a plurality of working heights can also be set in the case of installing an article storage shelf having a large height in order to increase the article storage efficiency, thus making it possible to perform a maintenance work for the article storage shelf in an appropriate manner.

Hereinafter, examples of a preferred embodiment of the present invention will be described.

In an embodiment of an article storage facility according to the present invention, it is preferable that the transport device includes an elevator body that is movable in the movement space in the vertical direction and that supports the transfer device such that the transfer device is movable in the transverse width direction of the shelf, all of the plurality of the support bodies, including the lowermost support body, are the movable support bodies, and the elevator body is located, in plan view, on the movement space side with respect to the movable support bodies at the withdrawal position, and is located at a position overlapping the movable support bodies at the acting position when viewed in the vertical direction.

With the above-described configuration, the elevator body is located, in plan view, on the movement space side with respect to the movable support body at the withdrawal position even if the elevator body is provided at a position overlapping the movable support body at the acting position when viewed in the vertical direction. Accordingly, the elevator body can be moved up and down without coming into contact with the movable support bodies by moving all of the plurality of movable support bodies to the withdrawal position.

This makes it possible to bring the elevator body close to the article storage shelf to the position overlapping the movable support body at the acting position when viewed in the vertical direction, thus allowing the article storage facility to be configured in a compact manner in the front-rear direction of the shelf.

In an embodiment of the article storage facility according to the present invention, it is preferable that the article storage facility further includes: a control device that controls operation of the transport device; a scaffold position detection device that detects a position of the elevating scaffold; and a support body position detection device that detects a position of the movable support bodies, wherein the control device is configured to regulate ascending/descending movement of the transfer device in a state in which the scaffold position detection device detects that the elevating scaffold is located below the withdrawal height, or in a state in which the support body position detection device detects that the movable support bodies are located on the acting position side with respect to the withdrawal position.

Since the withdrawal height of the elevating scaffold is set to be above the movement range of the transfer device in the vertical direction, there is no possibility that the elevator body and the transfer device come into contact with the elevating scaffold in a state in which the elevating scaffold is located at the withdrawal height even if the elevator body and the transfer device move up and down in the movement range. In contrast, in a state in which the elevating scaffold is located below the withdrawal height, there is the possibility that the transfer device may come into contact with the elevating scaffold as a result of the elevator body and the transfer device moving up and down in the ascending/descending movement range.

Further, when the front-rear width direction of the shelf of the article storage facility is made compact by providing the elevator body closer to the article storage shelf so as to be located, in plan view, on the movement space side with respect to the movable support body at the withdrawal position and to be located at a position overlapping the movable support body at the acting position when viewed in the vertical direction as in the above-described case, there is the possibility that the elevator body may come into contact with the movable support body at the acting position when the elevator body descends in a state in which the movable support body is being moved to the acting position.

In contrast, with the above-described configuration, the control device is configured to regulate ascending/descending movement of the transfer device in a state in which the scaffold position detection device detects that the elevating scaffold is located below the withdrawal height, or in a state in which the support body position detection device detects that the movable support body is located on the acting position side with respect the withdrawal position. Accordingly, the elevator body will not descend in a state in which the movable support body is being moved to the acting position, and it is therefore possible to prevent the elevator body and the transfer device from coming into contact with the elevating scaffold and the support body as described above.

In an embodiment of the article storage facility according to the present invention, it is preferable that the movable support body is provided so as to be placed and supported on a component of the article storage shelf in a state in which the movable support body is located at the acting position.

With the above-described configuration, the load of the elevating scaffold that is supported by the movable support body at the acting position can be received by a component of the article storage shelf, and therefore the elevating scaffold can be supported in an appropriate manner.

In an embodiment of the article storage facility according to the present invention, it is preferable that the article storage facility further includes: an entry/exit scaffold that is provided at a position aligned with the movement space in the transverse width direction of the shelf, and at a height at which an operator can move to and from the elevating scaffold at the working height; and a rotating shaft that is provided at a front end portion of the article storage shelf in a front-rear direction of the shelf and is rotatable about a rotation axis along the transverse width direction of the shelf, wherein the movable support body is configured to move to the acting position and the withdrawal position by swinging about a swing axis along the transverse width direction of the shelf in response to rotation of the rotating shaft, and a manual operating member that can be operated by an operator at the entry/exit scaffold is provided so as to extend from the rotating shaft toward the entry/exit scaffold.

With the above-described configuration, as a result of the operator located at the entry/exit scaffold rotating the rotating shaft using the manual operating member, the support body swings in response to the rotation of the rotating shaft, thus making it possible to swingably move the support body to the acting position and the withdrawal position. Accordingly, the support body can be readily moved as compared with a configuration in which an elongated member extending along the transverse width direction of the shelf is slidably moved in the front-rear direction of the shelf so as to move the support body to the acting position and the withdrawal position.

Also, the manual operating member is provided so as to be operated by the operator at the entry/exit scaffold and the operator can operate the manual operating member at the entry/exit scaffold through which the operator passes when moving to the elevating scaffold at the working height. Accordingly, it is possible to reduce the distance of movement of the operator when operating the manual operating member and moving the elevating scaffold.

In an embodiment of the article storage facility according to the present invention, it is preferable that the article storage facility further includes: an elevator body that is provided in the transport device, that is movable in the movement space in the vertical direction, and that supports the transfer device such that the transfer device is movable in the transverse width direction of the shelf; a pair of guide bodies that guide the elevator body in the vertical direction in a state in which the aforementioned guide bodies are located on both sides of the article storage shelf in the transverse width direction of the shelf; and an operating member detection device that detects a state of mounting of the manual operating member, wherein a length of the elevator body in the transverse width direction of the shelf is formed to be a length extending from the front of one of the guide bodies to the front of the other guide body, both end portions of the elevator body in the transverse width direction of the shelf are provided with guided extension portions that are extended rearward of a front end of the article storage shelf in the front-rear direction of the shelf and are guided by the guide bodies, the rotating shaft is provided in a state in which it is located between the two guided extension portions in the transverse width direction of the shelf, the manual operating member is removably provided at one end portion of the rotating shaft, and is configured to have a length so as to extend from the rotating shaft to the entry/exit scaffold side with respect to the guided extension portions in a state in which the manual operating member is mounted to the rotating shaft, and the control device is configured to regulate ascending/descending movement of the elevator body in a state in which the operating member detection device detects that the manual operating member is mounted to the rotating shaft.

With the above-described configuration, the guided extension portions of the elevator body moving up and down can be prevented from coming into contact with the rotating shaft and the manual operating member by separating the manual operating member from one end portion of the rotating shaft when the elevator body is moved up and down. Further, when the support body is operated to swing, the manual operating member is mounted to one end portion of the rotating shaft, and thereby the rotating shaft can be rotated so as to operate the support body to swing through operating the manual operating member from the entry/exit scaffold.

Further, the operating member detection device that detects the state of mounting of the manual operating member is provided, and the control device is configured to regulate the ascending/descending movement of the elevator body in a state in which the operating member detection device detects that the manual operating member is mounted to the rotating shaft. Accordingly, it is possible to prevent the elevator body from being moved up and down in a state in which the manual operating member is mounted to one end portion of the rotating shaft, thus preventing the elevator body from coming into contact with the manual operating member due to carelessness such as failing to separate the manual operating member.

In an embodiment of the article storage facility according to the present invention, it is preferable that the elevating scaffold is configured to be suspended and supported by a wire that is let out from a manually operated take-up roller and to move up and down with rotation operation of the take-up roller, a regulating device is provided that regulates rotation of the take-up roller when the elevating scaffold has moved down to the working height, and the regulating device includes a movable body that moves as a result of rotation operation of the take-up roller and a regulating body that regulates rotation of the take-up roller by coming into contact with the movable body when the elevating scaffold has moved down to the working height, and the height at which rotation of the take-up roller is regulated can be selected from the plurality of working heights by changing the position at which the movable body comes into contact with the regulating body.

The above-described configuration allows the operator to move the elevating scaffold down by operating the take-up roller to let the wire out, or to move the elevating scaffold up by operating the take-up roller to take up the wire.

Also, by changing the position of the regulating body according to the working height to which the elevating scaffold is lowered, the take-up roller cannot be operated to rotate even if the take-up roller is operated to rotate in order to let the wire out in a state in which the elevating scaffold has been lowered to the working height. Accordingly, the wire will not become loosen by being let out more than necessary, making it possible to prevent the wire wound around the take-up roller from becoming irregularly wound.

In an embodiment of the article storage facility according to the present invention, it is preferable that a first working height and a second working height that is lower than the first working height are set as the working heights, the regulating device is configured to be switchable between a first regulating state in which it regulates movement of the movable body by coming into contact with the movable body when the elevating scaffold has descended to the first working height and a second regulating state in which it regulates movement of the movable body by coming into contact with the movable body when the elevating scaffold has descended to the second working height, and a movement regulating member that is movable to a regulating position at which it regulates movement of the movable support body provided corresponding to the first working height and an allowable position at which it allows movement of the movable support body provided corresponding to the first working height, and a linking device that links the regulating device and the movement regulating member so as to move the movement regulating member to the regulating position as a result of the regulating device switched to the second regulating state, and to move the movement regulating member to the allowable position as a result of the regulating device switched to the first regulating state are provided.

With the above-described configuration, by switching the regulating device to the first regulating state, even if the take-up roller is operated to rotate in order to let the wire out in a state in which the elevating scaffold is lowered to the first working height, the take-up roller cannot be operated to rotate because the regulating body in the regulating device is in contact with the movable body. Further, by switching the regulating device to the second regulating state, even if the take-up roller is operated to rotate in order to let the wire out in a state in which the elevating scaffold has been lowered to the second working height, the take-up roller cannot be operated to rotate because the regulating body in the regulating device is in contact with the movable body. In this way, switching the regulating device to the first regulating state or the second regulating state makes it possible to prevent an irregular winding in the wire both in a state in which the elevating scaffold has been lowered to the first working height and in a state in which it has been lowered to the second working height.

Also, the movement regulating member is moved to the regulating position as a result of the regulating device switched to the second regulating state, thus regulating the movement from the withdrawal position to the acting position of the movable support body provided corresponding to the first working height. This makes it possible to prevent a situation where an irregular winding occurs in the wire as a result of the elevating scaffold brought into a state in which it is supported at the first working height due to the movement of the movable support body provided corresponding to the first working height from the withdrawal position to the acting position when the regulating device is switched to the second regulating state.

In an embodiment of the article storage facility according to the present invention, it is preferable that the support bodies are provided on both a first side and a second side across the movement space in the front-rear direction of the shelf, and an interlocking device is provided that interlocks the support bodies on the first side and the support bodies on the second side of the movable support bodies so as to move the support bodies on the second side to the acting position by moving the support bodies on the first side to the acting position, and move the support bodies on the second side to the withdrawal position by moving the support bodies on the first side to the withdrawal position.

With the above-described configuration, the support bodies are provided on both the first side and the second side across the movement space in the front-rear direction of the shelf, and therefore the elevating scaffold can be supported in a stable manner by supporting the elevating scaffold on the support bodies on the first side and the support bodies on the second side.

Also, the support bodies on the first side and the support bodies on the second side of the movable support bodies are interlocked by the interlocking device, and thus the operator will not forget to move either one of the support bodies on the first side and the support bodies on the second side to the withdrawal position or the acting position, thus making it possible to move the support bodies on the first side and the support bodies on the second side in an appropriate manner.

BRIEF DESCRIPTION OF THE DRAWINGS

FIG. 5 is a side view of the article storage facility;

FIGS. 6A and 6B are diagrams showing the elevating scaffold at a first working height;

FIGS. 7A and 7B are diagrams showing the elevating scaffold at a second working height;

FIG. 11 is a diagram showing the configuration surrounding a first entrance;

FIG. 17 is a flowchart illustrating a maintenance mode.

DETAILED DESCRIPTION

Hereinafter, an embodiment of the present invention will be described with reference to the drawings.

Figure 1:
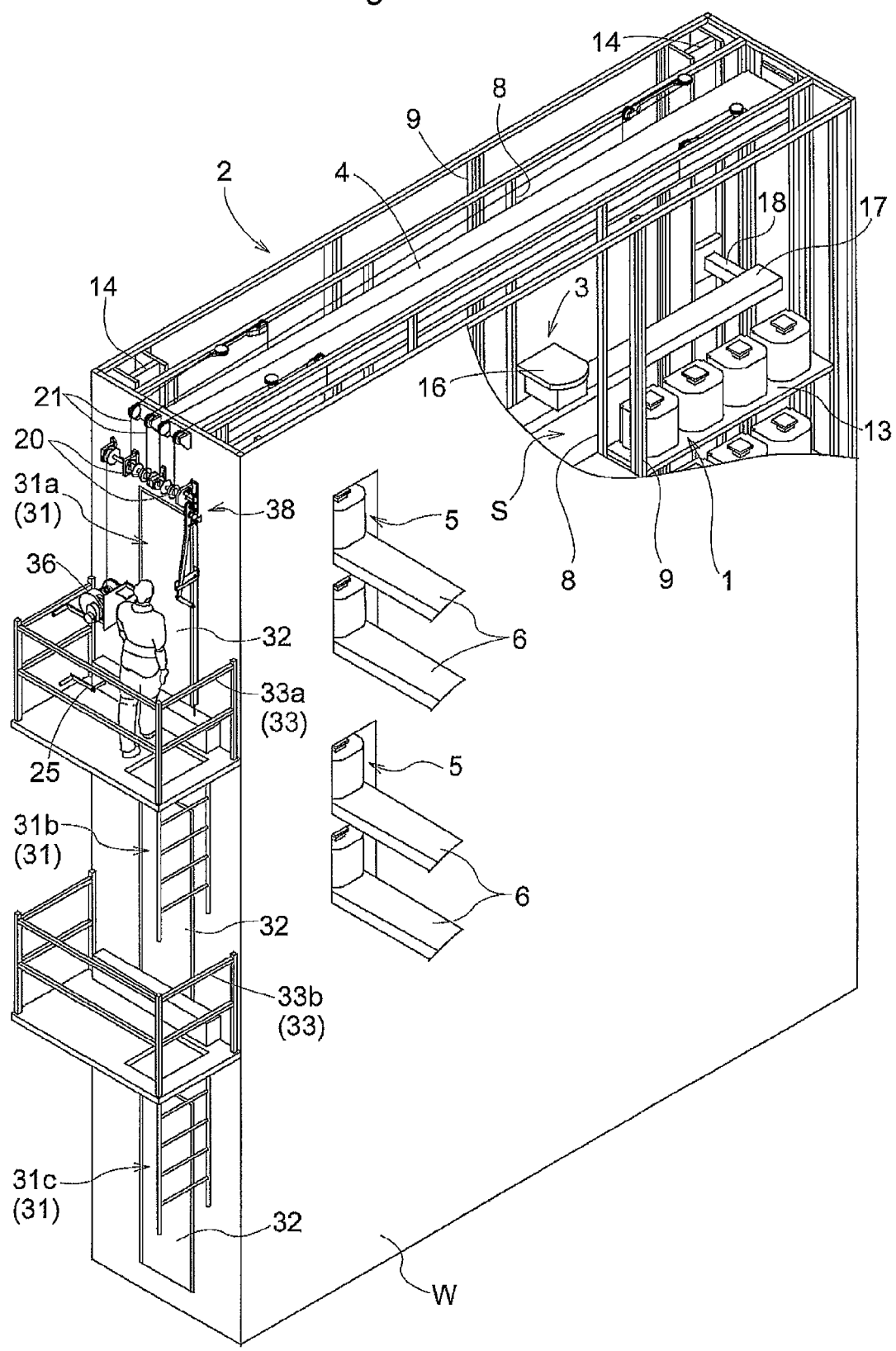
FIG. 1 is a partially cut-away, perspective view of an article storage facility.
Figure 2:
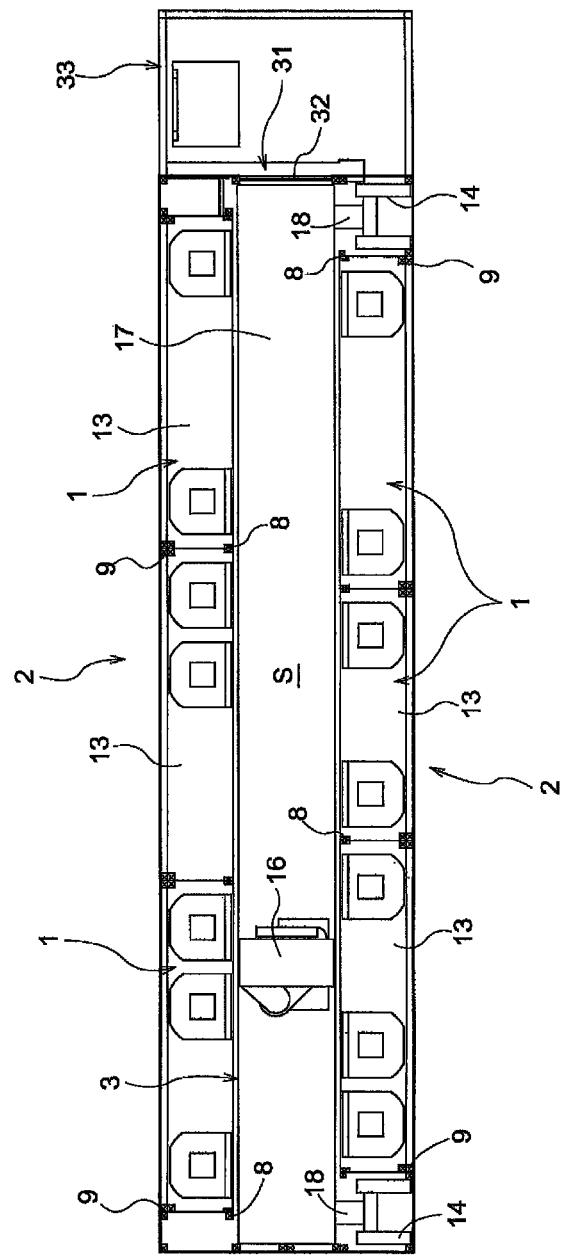
FIG. 2 is a plan view of the article storage facility, showing a transport device and article storage shelves.
Figure 3:
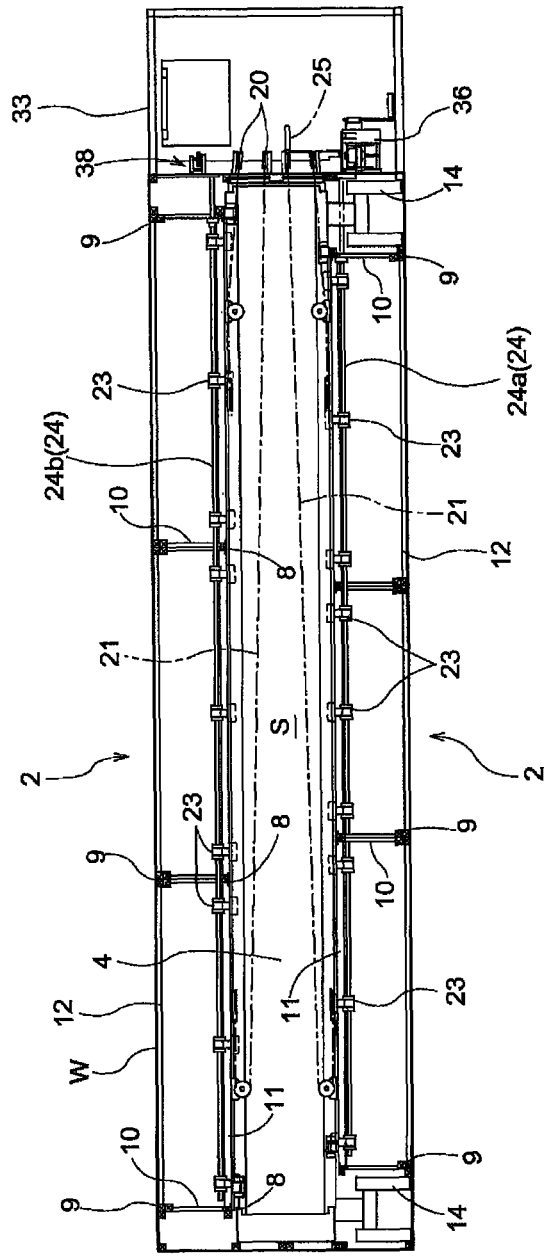
FIG. 3 is a plan view of the article storage facility, showing an elevating scaffold and the article storage shelves.

As shown in FIGS. 1 to 3, an article storage facility is provided with article storage shelves 2 in each of which storage portions 1 for storing articles are arranged in the vertical direction and the transverse width direction of the shelves (in the present example, the horizontal direction); a transport device 3 that transports articles to a plurality of storage portions 1 by moving a transfer device 16 in the vertical direction and the transverse width direction of the shelves in a movement space S located in front of the article storage shelves 2; an elevating scaffold 4 capable of ascending and descending in the movement space S in the vertical direction; and a surrounding wall W covering around the movement space S and the space in which the article storage shelves 2 are installed. The front-rear direction of the shelves is a direction orthogonal to both the vertical direction and the transverse width direction of the shelves.

As shown in FIG. 1, in place of the storage portions 1, transporting-in/out portions 5 are provided at a portion of each of the article storage shelves 2, and the transporting-in/out portions 5 are each provided with an article transporting-in/out device 6. Then, the transport device 3 transports articles between the transporting-in/out portions 5 and the corresponding storage portions 1, and the article transporting-in/out devices 6 transports articles between the transporting-in/out portions 5 and the outside of the surrounding wall W.

(Article Storage Shelf)

As shown in FIGS. 2 and 3, a pair of article storage shelves 2 are provided in a state in which they oppose each other, and the movement space S is formed between the paired article storage shelves 2.

In the present embodiment, one of the article storage shelves 2 is formed so as to be narrower than the other article storage shelf 2 in the transverse width direction of the shelves, the article storage shelf 2 that is wider in the transverse width direction of the shelves (hereinafter, referred to as the "wider article storage shelf 2") is provided protruding on both sides, in the transverse width direction of the shelves, from the article storage shelf 2 that is narrower in the transverse width direction of the shelves (hereinafter, referred to as "narrower article storage shelf 2").

As shown in FIG. 3, each of the article storage shelves 2 is formed as a frame including front struts 8, rear struts 9, front-rear horizontal members 10 extending along the front-rear direction and connected across the front struts 8 and the rear struts 9, a front-side horizontal member 11 that is connected to a plurality of the front struts 8 arranged in the transverse width direction of the shelves and extends along the transverse width direction of the shelves, a rear-side horizontal member 12 that is connected to a plurality of rear struts 9 arranged in the transverse width direction of the shelves and extends along the transverse width direction of the shelves. Further, as shown in FIG. 2, each of the article storage shelves 2 includes a support plate 13 for supporting articles, and is configured such that articles are stored in the storage portions 1 with the articles being placed and supported on the support plate 13.

Figure 4:
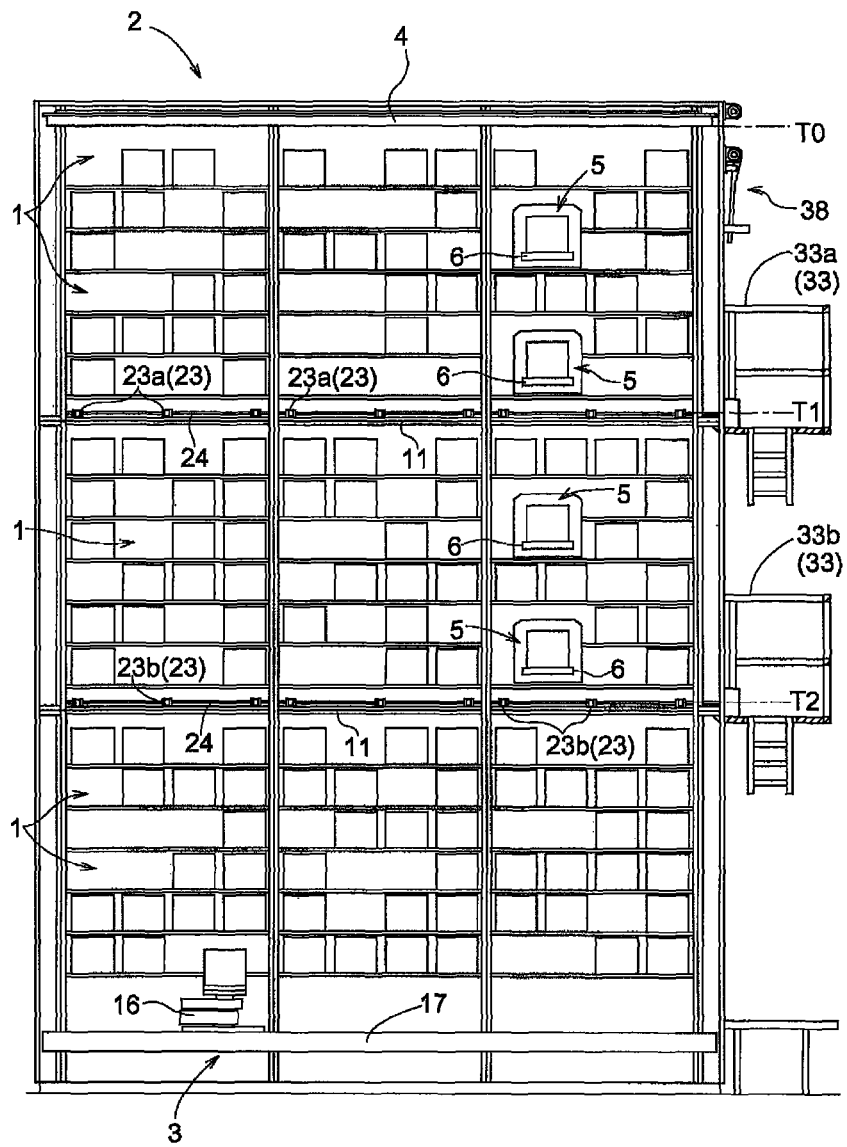
FIG. 4 is a front view of the article storage facility.

As shown in FIG. 4, each of the front-side horizontal members 11 is provided at a height located between the storage portions 1 that are adjacent in the vertical direction, and is provided so as not to prevent the transport device 3 from transporting articles to and from the storage portions 1.

(Transport Device)

As shown in FIGS. 2 and 4, the transport device 3 includes a transfer device 16 capable of transferring articles to and from the storage portions 1 and the transporting-in/out portions 5, and an elevator body 17 that is capable of moving in the movement space S in the vertical direction and supports the transfer device 16 such that the transfer device 16 can move in the transverse width direction of the shelves. As a result of the elevator body 17 moving in the vertical direction, the transfer device 16 also moves in the vertical direction. Additionally, the transfer device 16 is configured to travel/move on the elevator body 17 along the transverse width direction of the shelves. In other words, the transfer device 16 is configured to be movable in the movement space S in the vertical direction and the transverse width direction of the shelves.

As shown in FIG. 2, a pair of guide bodies 14 that guide the elevator body 17 in the vertical direction in a state in which the guide bodies 14 are located on both sides of the narrower article storage shelf 2 in the transverse width direction of the shelves. The pair of guide bodies 14 are provided aligned with the narrower article storage shelf 2 in the transverse width direction of the shelves, and are located on the front side of both end portions of the wider article storage shelf 2 in the transverse width direction of the shelves. Additionally, the pair of guide bodies 14 are located rearward of the front end of the narrower article storage shelf 2. Note that, the "front" as used for the article storage shelves 2 is the movement space S side in the front-rear direction of the shelf, and the "rear" is the opposite side.

The length of the elevator body 17 in the transverse width direction of the shelves is formed as a length extending from the front of one of the guide bodies 14 to the front of the other guide body 14, and guided extension portions 18 that are guided by the guide bodies 14 are provided at both end portions of the elevator body 17 in the transverse width direction of the shelves. The guided extension portions 18 are extended rearward of the front end of the narrower article storage shelf 2 in the front-rear direction of the shelves, and are engaged with the guide bodies 14 so as to be movable in the vertical direction. The elevator body 17 is configured to move in the vertical direction while the pair of guided extension portions 18 are being guided by the pair of guide bodies 14.

(Elevating Scaffold)

As shown in FIGS. 1 and 3, the elevating scaffold 4 is suspended and supported by a plurality of wires 21 that are let out from a manually operated take-up rollers 20, and is configured to move down by the wires 21 being let out from the take-up rollers 20, and to move up by the wires 21 being taken up by the take-up rollers 20. In this manner, the elevating scaffold 4 is configured to move up and down by the forward and backward rotation operations (the rotation operations in the forward direction and the backward direction) of the take-up rollers 20.

As shown in FIGS. 4 and 5, the elevating scaffold 4 is configured to be capable of moving up and down across a withdrawal height T0 that is set above the movement range of the transfer device 16 (the transport device 3) in the movement space S in the vertical direction, and working heights T1 and T2 that are set in intermediate locations in the movement space S in the vertical direction.

A plurality of working heights T1 and T2 are set in the vertical direction, and a first working height T1 and a second working height T2 that is lower than the first working height T1 are set as the working heights T1 and T2 in the present embodiment.

As shown in FIG. 4, causing the elevating scaffold 4 to be withdrawn to the withdrawal height T0 allows the transport device 3 to be moved up and down throughout its entire movement range in the vertical direction. Further, as shown in FIGS. 4 and 5, causing the transport device 3 to descend below the second working height T2 allows the elevating scaffold 4 to be moved down from the withdrawal height T0 to the first working height T1 and the second working height T2.

(Support Body)

As shown in FIGS. 5-7B, a plurality of support bodies 23 on which the elevating scaffold 4 at the working height is placed and supported are provided in the vertical direction so as to correspond to the respective working heights.

In the present embodiment, all of the plurality of support bodies 23 are configured to be movable to an acting position (see FIG. 8) at which they protrude toward the movement space S so as to support the elevating scaffold 4 and a withdrawal position (see FIG. 9) at which they retract toward the article storage shelf 2 so as not to come into contact with the elevating scaffold 4 moving up and down. In other words, in the present embodiment, all of the plurality of support bodies 23 correspond to "movable support bodies" in the present invention.

Figure 8:
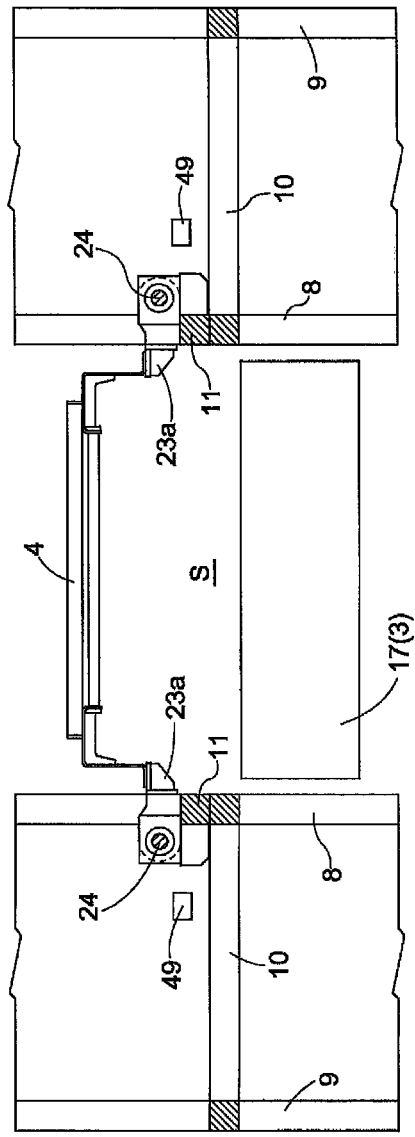
FIG. 8 is a diagram showing an acting position of a support body.
Figure 9:
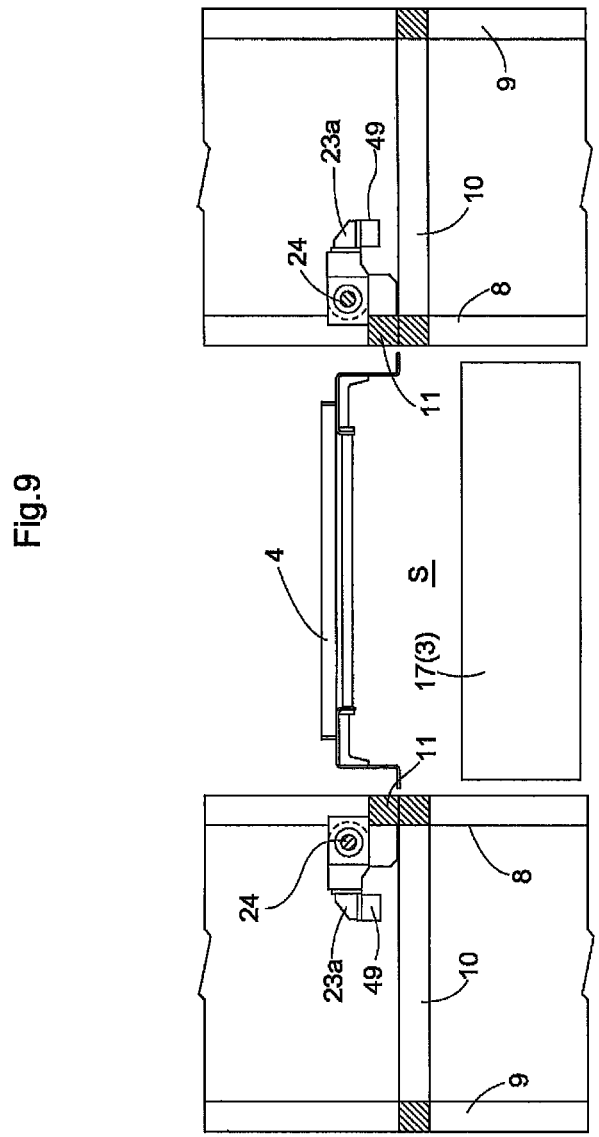
FIG. 9 is a diagram showing a withdrawal position of the support body.
Figure 10:
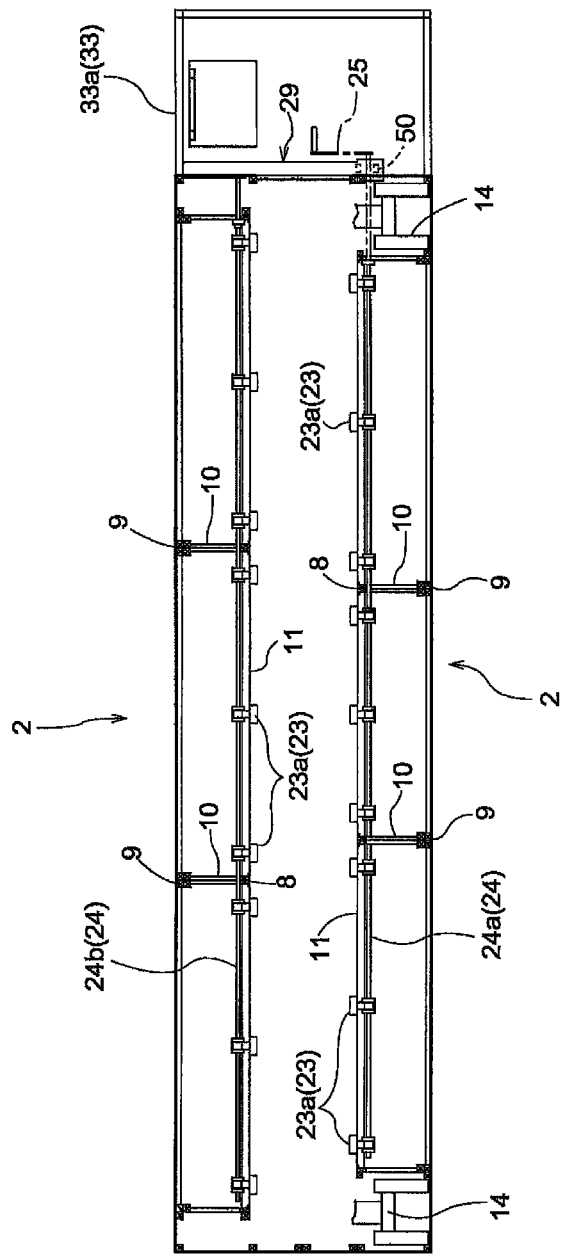
FIG. 10 is a plan view showing the interlocked state between a first support body and a second support body.

More specifically, the elevating scaffold 4 is located on the movement space S side with respect to the support body 23 at the withdrawal position shown in FIG. 9, and is provided at a position overlapping the support body 23 at the acting position shown in FIG. 8 when viewed in the vertical direction (in plan view). Accordingly, moving the support body 23 to the acting position allows the elevating scaffold 4 to be placed and supported on the support body 23 at the working heights T1 and T2, and moving the support body 23 to the withdrawal position allows the elevating scaffold 4 to be moved below the working heights T1 and T2 without interfering with the support body 23.

Likewise, the elevator body 17 (the transport device 3) is located on the movement space S side with respect to the support body 23 at the withdrawal position, and is provided at a position overlapping the support body 23 at the acting position when viewed in the vertical direction. Accordingly, moving the support body 23 to the withdrawal position allows the elevator body 17 to move up and down without interfering with the support body 23.

As shown in FIGS. 5-7B, a first support body 23a that supports the elevating scaffold 4 having moved down to the first working height T1 and a second support body 23b that supports the elevating scaffold 4 having moved down to the second working height T2 are provided as the support bodies 23.

Next, an additional description will be given of the configuration for moving the support bodies 23. The configuration for moving the first support body 23a and the configuration for moving the second support body 23b are configured in the same manner, and therefore, the configuration for moving the first support body 23a will be described, and the configuration for moving the second support body 23b shall be omitted.

As shown in FIG. 3, a rotating shaft 24 capable of rotating about a rotation axis along the transverse width direction of the shelves is provided at the front end portion of each of the article storage shelves 2 in the front-rear direction of the shelves, and the first support body 23a is configured to move to the acting position and the withdrawal position by swinging about the axis along the transverse width direction of the shelves in response to the pivoting of the rotating shaft 24.

To give an additional description, the rotating shafts 24 are provided at the respective front end portions of the wider article storage shelf 2 and the narrower article storage shelf 2. Also, a plurality of first support bodies 23a arranged in the transverse width direction of the shelves are connected with each rotating shaft 24, and pivoting of the rotating shaft 24 causes the plurality of first support bodies 23a to swingably move integrally with the rotating shaft 24. Thus, the first support bodies 23a are provided on both a first side and a second side across the movement space S in the front-rear direction of the shelves.

As shown in FIGS. 8 and 9, each of the rotating shafts 24 is provided rearward of the front end of the front-side horizontal member 11 in the front-rear direction of the shelves. Each of the first support bodies 23a is connected with the rotating shaft 24 in a cantilevered manner, and is configured to swingably move to the withdrawal position by swinging from the acting position upward so as to reverse its vertical orientation, and to swingably move to the acting position by swinging from the withdrawal position upward so as to reverse its vertical orientation. At the acting position, the leading edge of the first support body 23a is located forward of the front end of the front-side horizontal member 11, and at the withdrawal position, the leading edge of the first support body 23a is located rearward of the front end of the front-side horizontal member 11.

The first support body 23a is provided so as to be placed and supported on the front-side horizontal member 11 in a state in which it is located at the acting position. Here, the front-side horizontal member 11 corresponds to a component of the article storage shelf 2.

As shown in FIG. 3, of the rotating shafts 24, the primary rotating shaft 24a provided at the front end portion of the narrower article storage shelf 2 is provided in a state in which it is located between the two guided extension portions 18 in the transverse width direction of the shelves, and is set to have a length at which it does not interfere with the guided extension portion 18 of the elevator body 17.

As shown in FIGS. 3, 12A, 12B, and 13, the secondary rotating shaft 24b provided at the front end portion of the wider article storage shelf 2 extends toward an entry/exit scaffold 33, and its end portion is located outside the surrounding wall W.

A control lever 25 serving as a manual operating member for human operation is provided removably at one end portion of the primary rotating shaft 24a. The control lever 25 is configured to have a length extending from the primary rotating shaft 24a to the entry/exit scaffold 33 side with respect to the guided extension portion 18 in a state of being mounted to one end portion of the primary rotating shaft 24a, and the lever end portion is located outside the surrounding wall W. Accordingly, an operator at the entry/exit scaffold 33 can freely operate the control lever 25.

Here, the control lever 25 mounted to one end portion of the primary rotating shaft 24a is located between one of the guide bodies 14 and the movement space S.

Figure 12A:
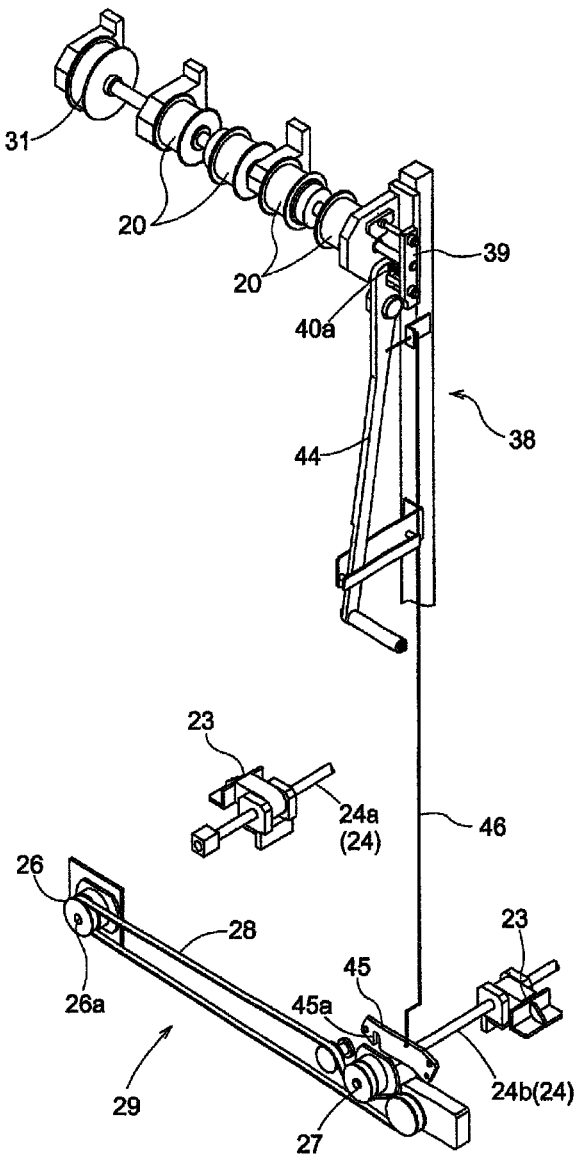
FIGS. 12A and 12B are diagrams showing a linkage between a regulating device and a movement regulating member.
Figure 12B:
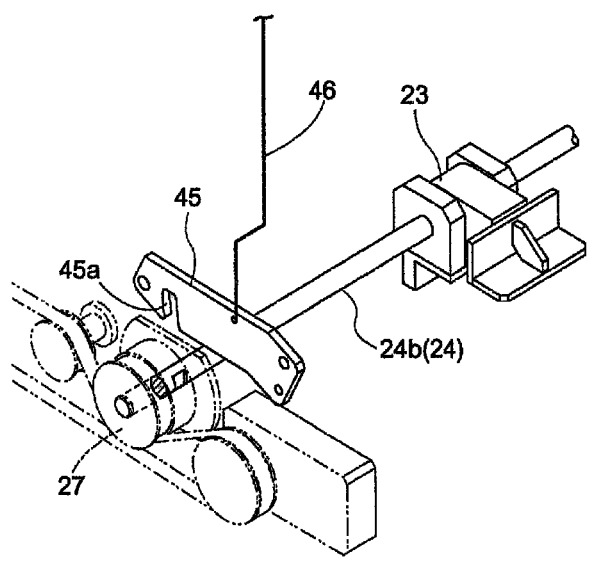
Figure 13:
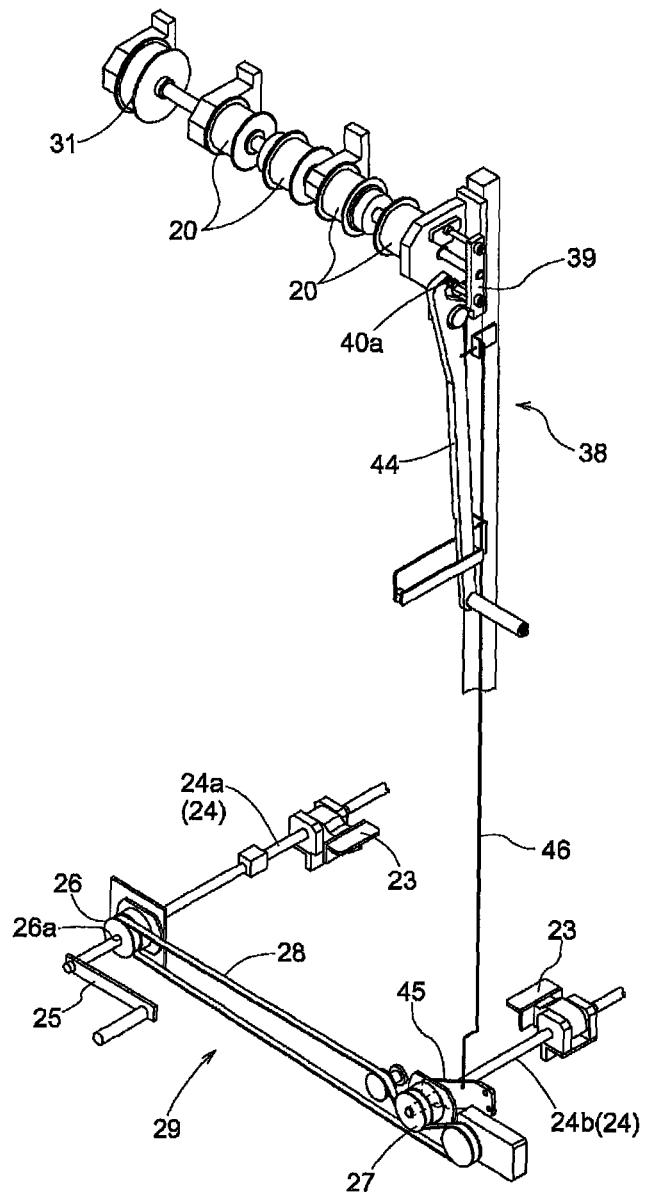
FIG. 13 is a diagram showing a linkage between the regulating device and the movement regulating member.

As shown in FIGS. 11 to 13, an interlocking device 29 is provided that interlocks the first support body 23a on the first side with the first support body 23a on the second side so as to move the first support body 23a on the second side to the acting position by moving the first support body 23a on the first side to the acting position, and to move the first support body 23a on the second side to the withdrawal position by moving the first support body 23a on the first side to the withdrawal position. Next, the interlocking device 29 will be described.

As shown in FIGS. 12A and 12B, a primary pulley 26 that includes an insertion hole 26a into which the control lever 25 is inserted and that rotates together with the control lever 25 inserted into the insertion hole 26a and a secondary pulley 27 that rotates together with the secondary rotating shaft 24b are provided, and a rotary belt 28 is wound around the primary pulley 26 and the secondary pulley 27. The primary pulley 26 is in contact with the rotary belt 28 from inside, whereas the secondary pulley 27 is in contact with the rotary belt 28 from outside, and thereby the secondary pulley 27 and the primary pulley 26 are rotated in opposite directions.

Then, as shown in FIG. 13, the control lever 25 is inserted into the insertion hole 26a of the primary pulley 26 so as to connect and mount the control lever 25 to the primary rotating shaft 24a. In this state, by rotating the control lever 25 at the entry/exit scaffold 33 outside the surrounding wall W, the primary rotating shaft 24a can be pivoted, thus allowing the first support body 23a connected with the primary rotating shaft 24a to swing to the acting position and the withdrawal position.

Additionally, this rotation operation of the control lever 25 can cause the primary pulley 26 and the secondary pulley 27 to rotate so as to pivot the secondary rotating shaft 24b, thus making it possible to cause the first support body 23a connected with the secondary rotating shaft 24b to swing to the acting position and the withdrawal position.

In this way, the first support body 23a on the first side and the first support body 23a on the second side are interlocked by the interlocking device 29 in order to to move the first support body 23a on the second side to the acting position by moving the first support body 23a on the first side to the acting position, and to move the first support body 23a on the second side to the withdrawal position by moving the first support body 23a on the first side to the withdrawal position. Here, the interlocking device 29 in the present example is constituted by an interlocking mechanism including the control lever 25, the primary pulley 26, the secondary pulley 27, and the rotary belt 28.

Note that the same control lever 25 is used to cause the first support body 23a to swing and to cause the second support body 23b to swing, so that a single control lever 25 is used to operate the first support body 23a or the second support body 23b. Thus, the first support body 23a and the second support body 23b are configured so as not to be operated simultaneously.

(Surrounding Wall)

As shown in FIG. 1, the surrounding wall W is provided with entrances 31 for allowing an operator to enter and exit the movement space S and doors 32 for opening and closing the entrances 31. A first entrance 31a corresponding to the first working height T1, a second entrance 31b corresponding to the second working height T2, and a floor entrance 31c corresponding to the floor height are provided as the entrances 31.

Also, entry/exit scaffolds 33 are fixedly provided in a state in which they are aligned with the movement space S in the transverse width direction of the shelves and at heights at which the operator can move between the entry/exit scaffolds 33 and the elevating scaffold 4 at the working heights. This provides a configuration that allows the operator to move to the elevating scaffold 4 at the working height by entering the movement space S from the entry/exit scaffolds 33 through the entrances 31. A first entry/exit scaffold 33a corresponding to the first working height and a second entry/exit scaffold 33b corresponding to the second working height are provided as the entry/exit scaffolds 33.

As shown in FIGS. 1 and 11, take-up rollers 20 are provided in locations above the first entrance 31a on the outer face side of the surrounding wall W in a state in which they rotate about the axis along the front-rear direction of the shelves. An interlocking rotor 34 that rotates integrally with the take-up rollers 20 are provided on one side of the take-up rollers 20 in the front-rear direction of the shelf, and the take-up rollers 20 and the interlocking rotor 34 rotate about the same axis. Additionally, a manually operated winch 36 linked to the interlocking rotor 34 by a linkage wire 35 is provided at a location that is below the interlocking rotor 34 and on the lateral side of the first entrance 31a.

The winch 36 is provided at a height at which it can be easily operated by the operator at the first entry/exit scaffold 33a, and the interlocking rotor 34 is rotated by the operator rotating the winch 36. Further, the take-up rollers 20 are rotated so as to take up or let out the wires 21 onto or from the take-up rollers 20, thus moving the elevating scaffold 4 up or down.

(Regulating Device)

A regulating device 38 is provided that regulates the rotation of the take-up rollers 20 when the elevating scaffold 4 has moved down to the working heights T1 and T2.

The regulating device 38 includes a movable body 39 that moves with the rotation of the take-up rollers 20 and a regulating body 40 that regulates the rotation of the take-up rollers 20 by coming into contact with the movable body 39 when the elevating scaffold 4 has moved down to the working height, and is configured to be capable of selecting, from a plurality of working heights, the working height at which the rotation of the take-up roller 20 is regulated, by changing the position at which the movable body 39 comes into contact with the regulating body 40.

Figure 14:
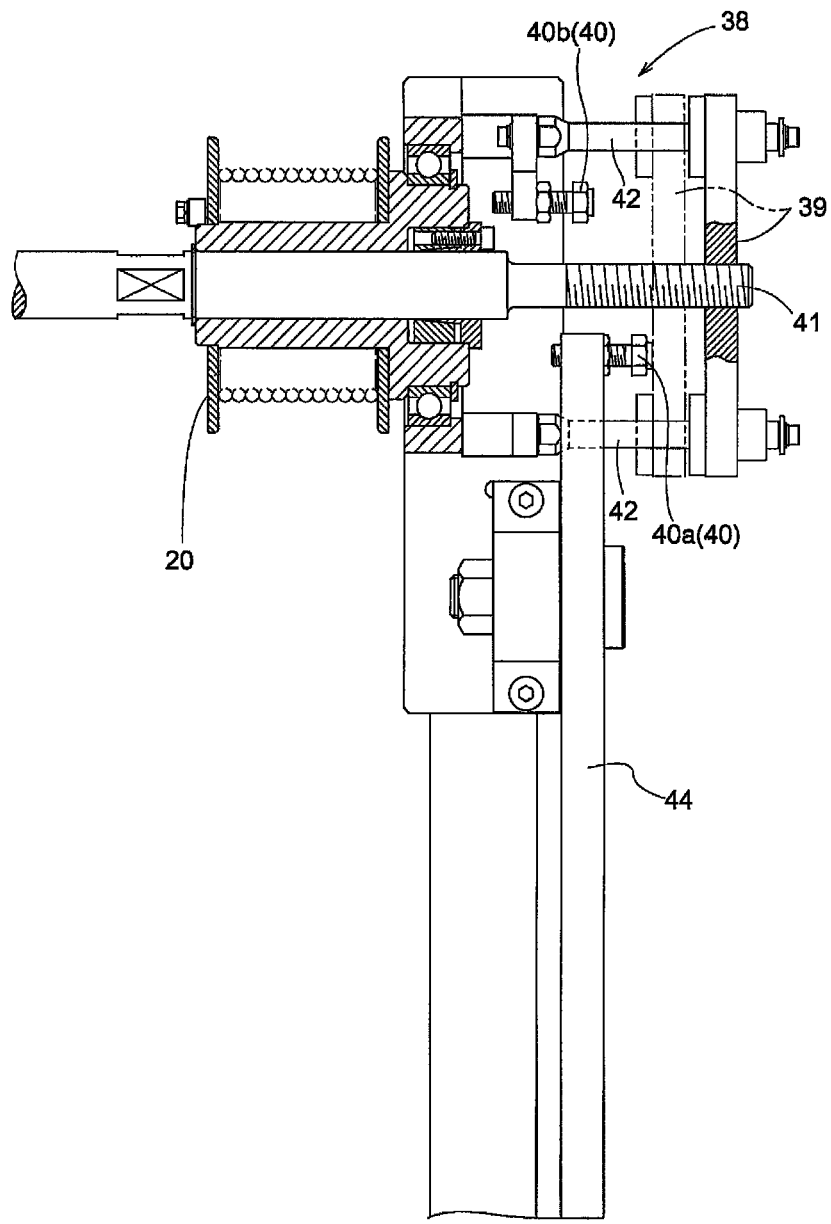
FIG. 14 is a diagram showing the regulating device.

To add a description on the regulating device 38, as shown in FIG. 14, on the side opposite to the side of the take-up rollers 20 where the interlocking rotor 34 is provided, an operation shaft 41 is provided in a state in which it rotates together with the take-up rollers 20. Additionally, a guide shaft 42 (in the present example, a pair of guide shafts 42) is provided parallel to the operation shaft 41. The movable body 39 of the regulating device 38 is fitted, at a portion thereof (for example, the proximal end portion), to the guide shaft 42 so as to slidably move along the axis direction of the guide shaft 42, and is screwed, at another portion thereof (for example, the front end portion or the central portion), with the screw portion of the operation shaft 41. For the movable body 39 provided in this manner, the rotation about the axis of the operation shaft 41 is regulated due to the proximal end portion being fitted to the guide shaft 42, and the movable body 39 slidably moves along the operation shaft 41 and the guide shaft 42 as the operation shaft 41 rotates with the take-up rollers 20.

The regulating device 38 includes a first regulating body 40*a* that comes into contact with the movable body 39 when the elevating scaffold 4 has moved down to the first working height T1 and a second regulating body 40*b* that comes into contact with the movable body 39 when the elevating scaffold 4 has moved down to the second working height T2. The first regulating body 40*a* is provided at the upper end portion of a swinging lever 44 serving as an operation body provided at a location on the lateral side of the first entrance 31*a*, and swinging the swing lever 44 allows the first regulating body 40*a* to be operated to move to an on-path position on the sliding movement path of the movable body 39 and an off-path position at which the first regulating body 40*a* is withdrawn from the sliding movement path of the movable body 39.

Then, moving the first regulating body 40*a* to the on-path position by the operator operating the swing lever 44 to swing causes the movable body 39 to come into contact with the first regulating body 40*a* when the elevating scaffold 4 has descended to the first working height, thus regulating the rotation of the take-up rollers 20 in the direction in which the wires 21 are let out.

Further, moving the first regulating body 40*a* to the off-path position by the operator operating the swing lever 44 to swing prevents the movable body 39 from coming into contact with the first regulating body 40*a* even when the elevating scaffold 4 has descended to the first working height, while causing the movable body 39 to come into contact with the second regulating body 40*b* when the elevating scaffold 4 has descended to the second working height, thus regulating the rotation of the take-up roller 20 in the direction in which the wire 21 is let out.

Thus, the regulating device 38 is configured to be switched to a first regulating state in which it comes into contact with the movable body 39 so as to regulate the movement of the movable body 39 when the elevating scaffold 4 has descended to the first working height by moving the first regulating body 40*a* to the on-path position, and to be switched to a second regulating state in which it comes into contact with the movable body 39 so as to regulate the movement of the movable body 39 when the elevating scaffold 4 has descended to the second working height by moving the first regulating body 40*a* to the off-path position. The regulating device 38 is configured to be switchable between the first regulating state and the second regulating state.

As shown in FIG. 11, the interlocking device 29 for the first support body 23*a* is provided in the vicinity of the lower end of the first entrance 31*a*. When a control lever 25 is mounted to the primary rotating shaft 24*a* of the first support body 23*a*, the control lever 25 can be rotated from the first entry/exit scaffold 33*a*.

Meanwhile, the interlocking device 29 for the second support body 23*b* is provided in the vicinity of the lower end of the second entrance 31*b*. When a control lever 25 is mounted to the primary rotating shaft 24*a* of the second support body 23*b*, the control lever 25 can be rotated from the second entry/exit scaffold 33*b*.

Also, a movement regulating member 45 is provided that is movable to a regulating position (see FIG. 13) at which the movement of the first support body 23*a* is regulated and an allowable position (see FIGS. 12A and 12B) at which the movement of the first support body 23*a* is allowed.

The movement regulating member 45 includes an engaging portion 45*a* that is swingable about the horizontal axis and is engageable with an end portion of the secondary rotating shaft 24*b* of the first support body 23*a*. To describe further, the end portion of the secondary rotating shaft 24*b* of the first support body 23*a* is formed such that its cross section has a shape obtained by cutting a portion of a perfect circle so as to form a pair of parallel planes, and is configured such that the movement regulating member 45 engages therewith in a phase in which the first support body 23*a* is located at the acting position or the withdrawal position, and the movement regulating member 45 does not engage therewith in the other phases. In the engaged state, the rotation of the secondary rotating shaft 24*b* is regulated by the movement regulating member 45, and thereby the movement of the first support body 23*a* from the acting position to the withdrawal position and that from the withdrawal position to the acting position are regulated.

The movement regulating member 45 is operatively connected with the swing lever 44 with a push-pull wire 46, and is configured as follows. As shown in FIGS. 12A and 12B, the movement regulating member 45 is pulled up and moved to the allowable position by operating the swing lever 44 to swing so as to move the first regulating body 40*a* to the on-path position, and as shown in FIG. 13, the movement regulating member 45 is pushed down and moved to the regulating position by operating the swing lever 44 swing so as to move the first regulating body 40*a* to the off-path position. Note that the push-pull wire 46 corresponds to the linking device in the present invention.

Accordingly, the movement regulating member 45 can be disengaged from the secondary rotating shaft 24*b* by switching the movement regulating member 45 to the first regulating state in which the first regulating body 40*a* is located at the on-path position, thus making it possible to move the first support body 23a from the acting position to the withdrawal position, or moving from the withdrawal position to the acting position through operation of the control lever 25. Further, the movement regulating member 45 can be engaged with the secondary rotating shaft 24b by switching the movement regulating member 45 to the second regulating state in which the first regulating body 40a is located at the off-path position, thus making it possible to prevent the first support body 23a from moving from the acting position to the withdrawal position, or moving from the withdrawal position to the acting position through operation of the control lever 25.

(Control Device)

Figure 15:
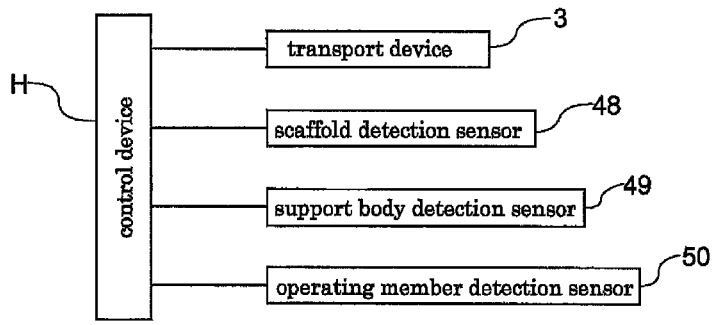
FIG. 15 is a control block diagram.

As shown in FIG. 15, the article storage facility is provided with a control device H that controls the operation of the transport device 3.

The control device H is configured to, in accordance with a transport command from an upper-level controller (not shown), control the travel/movement and the transfer operation of the transfer device 16, as well as the ascending/descending movement of the elevator body 17, so as to transport articles in the transporting-in/out portion 5 to the storage portion 1, or to transport articles in the storage portion 1 to the transporting-in/out portion 5.

Additionally, the article storage facility is provided with a scaffold detection sensor 48 as a scaffold position detection device for detecting the position of the elevating scaffold 4, a support body detection sensor 49 as a support body position detection device for detecting the position of the support body 23, and an operating member detection sensor 50 as an operating member detection device for detecting the state of mounting of the control lever 25. In the present example, the scaffold detection sensor 48, the support body detection sensor 49, and the operating member detection sensor 50 are each configured by a limit switch.

The scaffold detection sensor 48 is provided so as to be turned on as a result of its contact points coming into contact with each other when the elevating scaffold 4 has ascended to the withdrawal height T0, and be turned off as a result of its contact points being separated from each other when the elevating scaffold 4 has descended from the withdrawal height, thus detecting the presence of the elevating scaffold 4 at the withdrawal height T0.

The support body detection sensor 49 is provided so as to be turned on as a result of its contact points coming into contact with each other when the support body 23 has swung to the withdrawal position, and be turned off as a result of its contact points being separated from each other when the support body 23 has swung from the withdrawal position toward the acting position, thus detecting the presence of the support body 23 at the withdrawal position.

The operating member detection sensor 50 is provided so as to be turned on as a result of its contact points coming into contact with each other when the control lever 25 has been mounted to the primary rotating shaft 24a, and be turned off as a result of its contact points being separated from each other when the control lever 25 has been dismounted from the primary rotating shaft 24a, thus detecting the mounting of the control lever 25.

The control device H is configured to execute a transport operation mode and a maintenance mode. The control device H is configured to, in the transport operation mode, control the operation of the transport device 3 so as to transport articles in accordance with a transport command from the superordinate controller as described above, and in the maintenance mode, control the operation of the transport device 3 so as to move the elevator body 17 to the lowermost position within the range of the ascending/descending movement.

Figure 16:
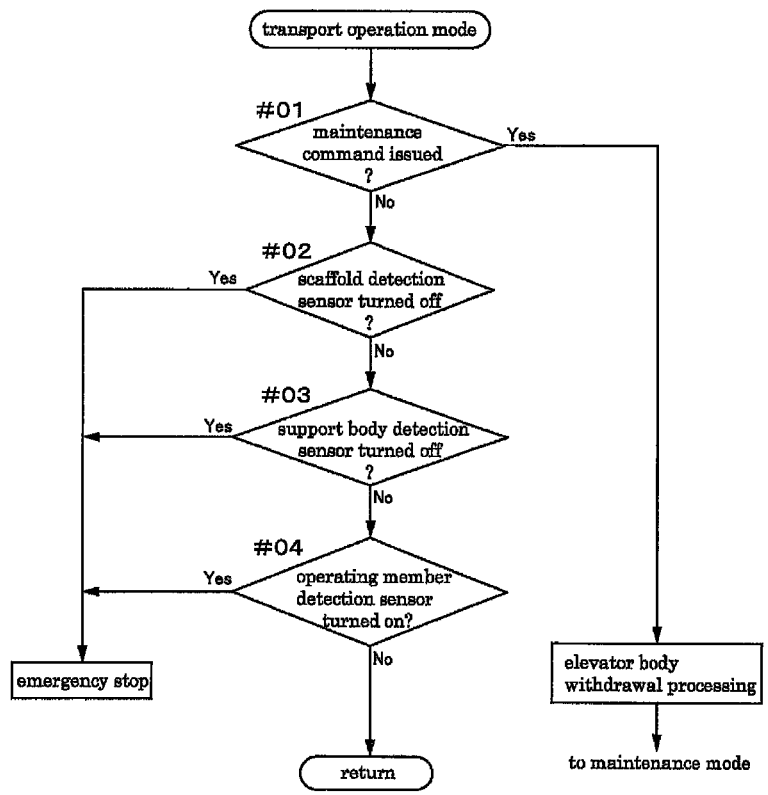
FIG. 16 is a flowchart illustrating a transport operation mode.

Then, as shown in the flowcharts in FIGS. 16 and 17, the control device H is configured to be switched to the maintenance mode when a maintenance operation switch (not shown) is depressed to issue a maintenance command in the transport operation mode (step #01: Yes), and to be switched to the transport operation mode when a recovery operation switch (not shown) is operated to issue a recovery command in the maintenance mode (step #10: Yes). The control device H is configured to execute elevator body withdrawal processing for moving the elevator body 17 below the second working height T2 when the mode is switched to the maintenance mode.

Additionally, the control device H is configured to perform emergency stop of the transport device 3 either when the scaffold detection sensor 48 is turned off (step #02: Yes), when the support body detection sensor 49 is turned off (step #03: Yes), or when the operating member detection sensor 50 is turned on (step #04: Yes) in the transport operation mode.

Also, as shown in the flowchart in FIG. 17, the control device H is configured to be switched to the transport operation mode only if the scaffold detection sensor 48 is turned on (step #11: Yes), the support body detection sensor 49 is turned on (step #12: Yes), and the operating member detection sensor 50 is turned off (step #13: Yes) when the mode is switched to the transport operation mode through operation of the recovery operation switch in the maintenance mode. In other words, the control device H is configured to not be switched to the transport operation mode unless all of the conditions: that the scaffold detection sensor 48 is turned on, the support body detection sensor 49 is turned on, and the operating member detection sensor 50 is turned off are satisfied.

Thus, the control device H is configured to regulate the ascending/descending movement of the elevator body 17 so as to prevent the elevator body 17 from moving up from the lowermost position within the range of the ascending/descending movement, in a state in which the scaffold detection sensor 48 detects that the elevating scaffold 4 is located below the withdrawal height (the scaffold detection sensor 48 is in the off-state), or in a state in which the support body detection sensor 49 detects that the support body 23 is located on the acting position side with respect to the withdrawal position (the support body detection sensor 49 is in the off-state), or in a state in which the operating member detection sensor 50 detects that the control lever 25 is mounted to the rotating shaft 24 (the operating member detection sensor 50 is in the on-state).

Other Embodiments (1) Although the lowermost support body 23 is configured to be movable to the acting position and the withdrawal position in the above-described embodiment, the lowermost support body 23 may be fixedly provided in the acting position. In this case, the transport device 3 is provided so as to be located on the movement space S side with respect to the support body 23 at the acting position, in order to avoid interference with the lowermost support body 23.

(2) Although two working heights, namely, the first working height and the second working height, are set as a plurality of working heights in the above-described embodiment, three or more working heights may be set as the plurality of working heights.

(3) Although the above-described embodiment adopts a configuration in which the support body 23 is placed and supported on a component of the article storage shelf 2 in a state in which it is located at the acting position, it is also possible to adopt a configuration in which the article storage shelf 2 is provided with a dedicated supporting member on which the support body 23 is placed and supported, and the support body 23 is placed and supported on the supporting member in a state in which it is located at the acting position. Alternatively, it is possible to adopt a configuration in which the support body 23 is prevented from being placed and supported on another member in a state in which the support body 23 is located at the acting position.

(4) The above-described embodiment adopts a configuration in which the front end portion of the article storage shelf 2 in the front-rear direction of the shelf is provided with the rotating shaft 24 capable of rotating about the rotation axis along the transverse width direction of the shelf, and the support body 23 is moved to the acting position and the withdrawal position by causing the support body 23 to swing about the axis along the transverse width direction of the shelf in response to the rotation of the rotating shaft 24. However, it is also possible to adopt a configuration in which the front end portion of the article storage shelf 2 in the front-rear direction of the shelf is provided with a slide member capable of slidably moving in the front-rear direction of the shelf, and the support body 23 is moved to the acting position and the withdrawal position by causing the support body 23 to slidably move in the front-rear direction of the shelf in response to the sliding movement of the slide member.

(5) The above-described embodiment adopts a configuration in which the ascending/descending movement of the elevator body 17 is regulated in a state in which the scaffold position detection device detects that the elevating scaffold 4 is located below the withdrawal height, or in a state in which the support body position detection device detects that the support body 23 is located on the acting position side with respect to the withdrawal position, or in a state in which the operating member detection device detects that the control lever 25 is mounted to the rotating shaft 24. However, it is also possible to adopt a configuration in which the ascending/descending movement of the elevator body 17 is not regulated even if any one or two of, or all of these three states are satisfied.

Although each of the scaffold position detection device, the support body position detection device, and the operating member detection device is configured by a limit switch in the above-described embodiment, some or all of these detection devices may be formed by a different sensor such as a light projecting/receiving photoelectric sensor.

(6) Although the above-described embodiment adopts a configuration in which the first regulating body 40a and the second regulating body 40b are provided, and the first regulating body 40a is moved to switch between the first regulating state and the second regulating state. However, it is also possible to adopt a configuration in which a single regulating body 40 is moved to the first regulating position and the second regulating position to switch between the first regulating state and the second regulating state.

Additionally, the regulating device 38 that regulates the rotation of the take-up rollers 20 when the elevating scaffold 4 has moved down to the working height does not have to be provided if unnecessary.

(7) Although the linking device that links the regulating device 38 to the movement regulating member 45 is provided in the above-described embodiment, it is possible to separately operate the regulating device 38 and the movement regulating member 45 without providing the linking device. Further, although the movement regulating member 45 for regulating the movement of the support body 23 corresponding to the second working height T2 is provided, it is not necessary to provide the movement regulating member 45 if there is no need to regulate the movement of the support body 23.

(8) The above-described embodiment adopts a configuration in which the interlocking device 29 that interlocks the support body 23 on the first side and the support body 23 on the second side is provided, and operating the support body 23 on the first side causes the support body 23 on the second side to be also operated. However, it is also possible to adopt a configuration in which the support body 23 on the first side and the support body 23 on the second side are separately operated to move, without providing the interlocking device 29.

The invention claimed is:

1. An article storage facility comprising:
  an article storage shelf having storage portions for storing articles, each storage portion being configured such that an article is moved into and out of the storage portion along a front to rear direction of the shelf, the storage portions being arranged in a vertical direction and a transverse width direction of the shelf, the transverse width direction being horizontal and perpendicular to the front to rear direction of the shelf;
  a transport device that transports articles, one at a time, laterally along the transverse width direction and vertically to the plurality of storage portions arranged along the transverse width direction and the vertical direction;
  a transfer device that is provided in the transport device and that transfers the article to and from the storage portion by moving the article in and out of the storage portion along the front to rear direction, the transfer device being configured to be movable in a movement space in the vertical direction and the transverse width direction of the shelf, the movement space being located in front of the article storage shelf with respect to the front to rear direction;
  an elevating scaffold capable of ascending and descending in a movement space between a withdrawal height, the withdrawal height defined above a movement range of the transfer device in the movement space in the vertical direction, and working heights that are defined at intermediate locations in the movement space in the vertical direction; and
  a support body provided for each of the working heights for supporting the elevating scaffold when the elevating scaffold is located at corresponding one of the working heights,
  wherein
  at least the support body provided for each of the working heights other than a lowermost one of the working heights is a movable support body that is configured to be movable to an acting position at which said support body protrudes toward the movement space so as to support the elevating scaffold and a withdrawal position at which said support body is retracted toward the article storage shelf so as not to come into contact with the elevating scaffold as the elevating scaffold ascends and descends, and wherein the elevating scaffold is configured to be suspended and supported by a wire that is let out from a manually operated take-up roller and to ascend and descend with rotation operation of the take-up roller, a regulating device is provided that regulates rotation of the take-up roller when the elevating scaffold has moved down to one of the working heights, and the regulating device comprises a movable body that moves as a result of rotation operation of the take-up roller and one or more regulating bodies for restricting rotation of the take-up roller by coming into contact with the movable body when the elevating scaffold has moved down to corresponding one or more of the working heights, and the height at which rotation of the take-up roller is restricted can be selected from the working heights by changing the position at which the movable body comes into contact with one of the one or more regulating bodies.

2. The article storage facility according to claim 1, wherein the transport device comprises an elevator body that is movable in the movement space in the vertical direction and that supports the transfer device such that the transfer device is movable in the transverse width direction of the shelf, each said support body including the support body provided for the lowermost one of the working heights is the movable support body, and the elevator body is located, in plan view, on the movement space side with respect to each said movable support body in the withdrawal position, and is located at a position in which the elevator body overlaps with each said movable support body in the acting position when viewed in the vertical direction.

3. The article storage facility according to claim 2, further comprising:
   a control device that controls operation of the transport device;
   a scaffold position detection device that detects a position of the elevating scaffold; and
   a support body position detection device that detects a position of a corresponding movable support body,
   wherein the control device is configured to restrict the ascending and descending movement of the transfer device when the scaffold position detection device detects that the elevating scaffold is located below the withdrawal height, or when the support body position detection device detects that a movable support body is located away from the withdrawal position toward the acting position.

4. The article storage facility according to claim 1, wherein the movable support body is provided so as to be placed and supported on a component of the article storage shelf when the movable support body is located at the acting position.

5. The article storage facility according to claim 1, further comprising:
   an entry and exit scaffold that is provided at a position aligned with the movement space in the transverse width direction of the shelf, and at a height at which an operator can move to and from the elevating scaffold when the elevating scaffold is at at least one of the working heights; and
   a rotating shaft that is provided at a front end portion of the article storage shelf and is rotatable about a rotation axis along the transverse width direction of the shelf,
   wherein the movable support body is configured to move to the acting position and the withdrawal position by swinging about a swing axis along the transverse width direction of the shelf in response to rotation of the rotating shaft, and
   a manual operating member that can be operated by an operator at the entry and exit scaffold is provided so as to extend from the rotating shaft toward the entry and exit scaffold.

6. The article storage facility according to claim 5, further comprising:

an elevator body that is provided in the transport device, that is movable in the movement space in the vertical direction, and that supports the transfer device such that the transfer device is movable in the transverse width direction of the shelf;
a pair of guide bodies that guide the elevator body in the vertical direction with each of the pair of guide bodies located in a corresponding side end area of the article storage shelf in the transverse width direction of the shelf; and
an operating member detection device that detects a state of mounting of the manual operating member,
wherein a length of the elevator body in the transverse width direction of the shelf is formed to be a length extending from a front area of one of the pair of guide bodies to a front area of the other of the pair of guide bodies,
each end portion of the elevator body in the transverse width direction of the shelf is provided with a guided extension portion that extends rearwardly of a front end of the article storage shelf in the front to rear direction of the shelf and that is guided by a corresponding one of the pair of the guide bodies,
the rotating shaft is provided such that the rotating shaft is located between the two guided extension portions in the transverse width direction of the shelf,
the manual operating member is removably provided at one end portion of the rotating shaft, and is configured to have a length so as to extend from the rotating shaft toward the entry and exit scaffold beyond a corresponding guided extension portion when the manual operating member is mounted to the rotating shaft, and
the control device is configured to regulate the ascending and descending movement of the elevator body when the operating member detection device detects that the manual operating member is mounted to the rotating shaft.

7. The article storage facility according to claim 1,
wherein the working heights include a first working height and a second working height that is lower than the first working height,
wherein the one or more of regulating bodies include a first regulating body associated with the first working height and a second regulating body associated with the second working height,
wherein the regulating device is configured to be switchable between a first regulating state in which the first regulating body restricts movement of the movable body by coming into contact with the movable body when the elevating scaffold has descended to the first working height and a second regulating state in which the second regulating body restricts movement of the movable body by coming into contact with the movable body when the elevating scaffold has descended to the second working height, and
wherein the article storage facility further comprises:
a movement regulating member that is movable to a regulating position at which the movement regulating member restricts movement of the movable support body provided for the first working height and an allowable position at which the movement regulating member allows movement of the movable support body provided for the first working height, and
a linking device that links the regulating device and the movement regulating member so as to move the movement regulating member to the regulating position when the regulating device is switched to the second regulating state, and to move the movement regulating member to the allowable position when the regulating device is switched to the first regulating state.

8. The article storage facility according to claim 1, wherein the movable support bodies are provided on each of a first side and a second side across the movement space on a front end portion of the shelf, and an interlocking device is provided that interlocks the movable support body on the first side and the movable support body on the second side so as to move the movable support body on the second side to the acting position by moving the movable support body on the first side to the acting position, and to move the movable support body on the second side to the withdrawal position by moving the movable support body on the first side to the withdrawal position.

9. The article storage facility according to claim 1, wherein the elevating scaffold is configured to be movable independently of the transport device.

10. The article storage facility according to claim 1, wherein the elevating scaffold is configured to allow an operator to walk thereon.

11. The article storage facility according to claim 1, wherein the movable support body is configured to be rotationally movable.

12. The article storage facility according to claim 1, wherein the elevating scaffold extends generally along the lateral width direction of the shelf.

13. An article storage facility comprising:
an article storage shelf having storage portions for storing articles, each storage portion being configured such that an article is moved into and out of the storage portion along a front to rear direction of the shelf, the storage portions being arranged in a vertical direction and a transverse width direction of the shelf, the transverse width direction being horizontal and perpendicular to the front to rear direction of the shelf;
a transport device that transports articles, one at a time, laterally along the transverse width direction and vertically to the plurality of storage portions arranged along the transverse width direction and the vertical direction;
a transfer device that is provided in the transport device and that transfers the article to and from the storage portion by moving the article in and out of the storage portion along the front to rear direction, the transfer device being configured to be movable in a movement space in the vertical direction and the transverse width direction of the shelf, the movement space being located in front of the article storage shelf with respect to the front to rear direction;
an elevating scaffold capable of ascending and descending in the movement space between a withdrawal height, the withdrawal height defined above a movement range of the transfer device in the movement space in the vertical direction, and working heights that are defined at intermediate locations in the movement space in the vertical direction;
a support body provided for each of the working heights for supporting the elevating scaffold when the elevating scaffold is located at corresponding one of the working heights,
an entry and exit scaffold that is provided at a position aligned with the movement space in the transverse width direction of the shelf, and at a height at which an operator can move to and from the elevating scaffold when the elevating scaffold is at least one of the working heights; and a rotating shaft that is provided at a front end portion of the article storage shelf and is rotatable about a rotation axis along the transverse width direction of the shelf,
wherein at least the support body provided for each of the working heights other than a lowermost one of the working heights is a movable support body that is configured to be movable to an acting position at which said support body protrudes toward the movement space so as to support the elevating scaffold and a withdrawal position at which said support body is retracted toward the article storage shelf so as not to come into contact with the elevating scaffold as the elevating scaffold ascends and descends, and
wherein the movable support body is configured to move to the acting position and the withdrawal position by swinging about a swing axis along the transverse width direction of the shelf in response to rotation of the rotating shaft, and
a manual operating member that can be operated by an operator at the entry and exit scaffold is provided so as to extend from the rotating shaft toward the entry and exit scaffold.

14. An article storage facility comprising:
an article storage shelf having storage portions for storing articles, each storage portion being configured such that an article is moved into and out of the storage portion along a front to rear direction of the shelf, the storage portions being arranged in a vertical direction and a transverse width direction of the shelf, the transverse width direction being horizontal and perpendicular to the front to rear direction of the shelf;
a transport device that transports articles, one at a time, laterally along the transverse width direction and vertically to the plurality of storage portions arranged along the transverse width direction and the vertical direction;
a transfer device that is provided in the transport device and that transfers the article to and from the storage portion by moving the article in and out of the storage portion along the front to rear direction, the transfer device being configured to be movable in a movement space in the vertical direction and the transverse width direction of the shelf, the movement space being located in front of the article storage shelf with respect to the front to rear direction;
an elevating scaffold capable of ascending and descending in the movement space between a withdrawal height, the withdrawal height defined above a movement range of the transfer device in the movement space in the vertical direction, and working heights that are defined at intermediate locations in the movement space in the vertical direction; and
a support body provided for each of the working heights for supporting the elevating scaffold when the elevating scaffold is located at corresponding one of the working heights,
wherein at least the support body provided for each of the working heights other than a lowermost one of the working heights is a movable support body that is configured to be movable to an acting position at which said support body protrudes toward the movement space so as to support the elevating scaffold and a withdrawal position at which said support body is retracted toward the article storage shelf so as not to come into contact with the elevating scaffold as the elevating scaffold ascends and descends, and wherein the movable support bodies are provided on each of a first side and a second side across the movement space on a front end portion of the shelf, and an interlocking device is provided that interlocks the movable support body on the first side and the movable support body on the second side so as to move the movable support body on the second side to the acting position by moving the movable support body on the first side to the acting position, and to move the movable support body on the second side to the withdrawal position by moving the movable support body on the first side to the withdrawal position.

* * * * *